United States Patent [19]

Nishitani et al.

[11] Patent Number: 4,571,737
[45] Date of Patent: Feb. 18, 1986

[54] ADAPTIVE DIFFERENTIAL PULSE CODE MODULATION DECODING CIRCUIT

[75] Inventors: Takao Nishitani; Ichiro Kuroda; Tadaharu Kato, all of Tokyo, Japan

[73] Assignee: NEC Corporation, Tokyo, Japan

[21] Appl. No.: 558,236

[22] Filed: Dec. 5, 1983

[30] Foreign Application Priority Data

| Dec. 10, 1982 | [JP] | Japan | 57-216710 |
| Dec. 14, 1982 | [JP] | Japan | 57-218692 |
| Feb. 21, 1983 | [JP] | Japan | 58-27179 |
| Feb. 21, 1983 | [JP] | Japan | 58-27180 |
| Mar. 31, 1983 | [JP] | Japan | 58-55442 |
| Mar. 31, 1983 | [JP] | Japan | 58-55443 |

[51] Int. Cl.$^4$ ............................................. H04B 14/06
[52] U.S. Cl. .................................. 375/27; 332/11 D; 340/347 DD
[58] Field of Search ............................. 375/27, 28, 30; 358/135, 133; 340/347 DD, 347 AD, 347 DA; 332/11 D

[56] References Cited

U.S. PATENT DOCUMENTS 4,179,710 12/1979 Ishiguro et al. ....................... 375/27
4,319,082 3/1982 Gilloire et al. ....................... 375/27
4,437,087 3/1984 Petr ............................. 340/347 DD

OTHER PUBLICATIONS

"Proceedings of ICASSP 82" published by IEEE, May, 1982, pp. 960 to 963.
"Transactions on Communications" pp. 1362 to 1365, published by IEEE, in the year of 1975.
"Proceedings of IEEE", Apr. 1980, pp. 488 to 525.

Primary Examiner—Robert L. Griffin
Assistant Examiner—Stephen Chin
Attorney, Agent, or Firm—Sughrue, Mion, Zinn, Macpeak, and Seas

[57] ABSTRACT

In an APDCM decoding circuit, an adaptive inverse quantizer which forms a quantized coded signal, produces a residual signal and upper and lower limits thereof. An adaptive prediction circuit uses the residual signal to predict a quantization, which is added to the other signals. The added residual is converted into a nonlinear encoded PCM for output. However the output is PCM linearized and compared to the added upper and lower limits to determine if the output should be incremented or decremented.

7 Claims, 9 Drawing Figures

ADAPTIVE DIFFERENTIAL PULSE CODE MODULATION DECODING CIRCUIT

BACKGROUND OF THE INVENTION

This invention relates to an adaptive differential pulse code modulation (ADPCM) circuit in which PCM encoding and ADPCM encoding are alternately repeated, and more particularly an improved ADPCM decoding circuit in which quantized noises do not accumulate.

An ADPCM is described in detail in "Proceedings of IEEE", April, 1980, pages 488 to 525, and an improved ADPCM free from transmission line bit error is described in detail in "Proceedings of ICASSP" published by IEEE, May, 1982, pages 960 to 963.

As will be described later in more detail when a plurality of ADPCM encoder/decoders are connected in cascade, a problem that the degradation of the characteristic accumulates has hitherto arisen.

SUMMARY OF THE INVENTION

Accordingly, it is an object of this invention to provide an improved ADPCM decoding circuit wherein degradation of the characteristic does not accumulate even when a plurality of ADPCM encoder/decoders having a nonlinear quantizing characteristic are connected in cascade via PCM encoding.

Another object of this invention is to provide a method of preventing accumulation of the degradion of the characteristic when a number of ADPCM encoder/decoders are connected in cascade by merely adding an auxiliary circuit to the ADPCM decoding circuit without changing the characteristic of the prior art ADPCM encoding circuit.

Still another object of this invention is to provide a novel ADPCM decoding circuit having overload detecting means capable of preventing accumulation of degradation of characteristic at the time of cascade connection without depending upon the construction of the ADPCM decoding circuit and adaptive predicting circuit as well as the quantizing characteristic of the adaptive quantizing circuit.

According to this invention, there is provided an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, characterized in that there are provided an adaptive inverse quantizer which produces, from a quantized coded signal produced by the ADPCM encoder, a representative residual value signal, a lower limit residual signal and a higher limit residual signal in accordance with the residual signal on the side of the encoder, and which determines a quantizing characteristic at a next sampling time in accordance with the quantized coded signal; adder means adding an adaptive prediction signal to be described later to each of the representative residual value signal, lower limit residual signal and higher limit residual signal produced by the adaptive inverse quantizer for producing a representative decoded value signal, a lower limit decoded value signal and a higher limit decoded value signal; a nonlinear PCM converter for converting the representative decoded signal into a nonlinear coded PCM signal to form a nonlinear PCM signal; a linear PCM converter linearizing the nonlinear PCM signal for producing a linear PCM signal; comparator means for comparing the output linear PCM signal with the lower limit decoded value signal and with the higher limit decoded value signal to form a nonlinear PCM decoded signal which corresponds to the nonlinear PCM signal, the nonlinear PCM signal added with $+1$ or the nonlinear PCM sinal added with $-1$; and an adaptive predicion circuit inputted with the representative decoded value signal or the representative decoded value signal together with the representative residual value signal for producing an adaptive predicion signal at a present time and for determining a predicion characteristic at a next sampling time; whereby in a cascade connected condition in which a PCM encoding/decoding and an ADPCM encoding/deconding are repeated alternately, once internal state variable conditions for respective ADPCM encoding/decoding circuits have coincided perfectly, in the following time, degradation of the characteristic caused by the cascade connection is made to be the same as that of one ADPCM stage.

According to another embodiment of this invention, there is provided an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, characterized in that there are provided an adaptive inverse quantizer which produces, from a quantized coded signal produced by the ADPCM encoder, a representative residual value signal, a lower limit residual signal and a higher limit residual signal in accordance with the residual signal on the side of the encoder, and which determines a quantizing characteristic at a next sampling time in accordance with the quantized code signal; adder means adding an adaptive prediction signal to be described later to the representative residual signal from the adaptive inverse quantizer for producing a representative decoded signal; a nonlinear PCM converter for converting the representative decoded signal into a nonlinear coded PCM signal; a linear PCM converter for linearizing the output of the nonlinear PCM converter; subtracting means subtracting the adaptive prediction signal from the output signal of the linear PCM converter for producing a representative decoded residual signal; comparator means for comparing the representative decoded residual signal with the lower limit residual signal and with the higher limit residual signal to form a nonlinear PCM decoded signal which corresponds to the nonlinear PCM converter output signal, the nonlinear PCM converter output signal added with $+1$ or the nonlinear PCM converter output signal added with $-1$; and an adaptive prediction circuit inputted with the representative decoded signal or with the representative decoded signal together with the representative residual signal for producing an adaptive prediction signal at a present time and for determining a prediction characteristic at a next sampling time, whereby the adaptive inverse quantizer produces producing higher limit and lower limit residual signals in addition to the representative residual signal and values of these signals correct the nonlinear PCM code of the representative decoded signal so as to form the nonlinear PCM decoded signal.

According to still another embodiment of this invention, there is provided an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, characterized in that there are provided an adaptive inverse quantizer which produces, from a quantized coded signal produced by the ADPCM encoder, a representative residual signal, a lower limit residual signal and a higher limit residual signal in accordance with the residual signal on the side of the encoder, and which determines a quantizing characteristic at a next sampling time in accordance with the quantized coded signal; adder means adding an adaptive prediction signal to be described later to the representative residual signal from the adaptive inverse quantizer producing a representative decoded signal; a nonlinear PCM converter for converting the representative decoded signal into a nonlinear coded PCM signal; a linear PCM converter linearizing an output of the nonlinear PCM converter; subtracting means subtracting the adaptive prediction signal from an output signal of the linear PCM converter for producing a representative residual signal; comparator means which, when the quantized coded signal from the ADPCM encoder is not at an upper or lower limit, that is, not overloaded, compares the represintative decoded residual signal with the lower limit residual signal and with the higher limit residual signal whereas when the quantized coded signal is a positive overload code, compares the representative decoded residual signal with the lower limit residual signal and further when the quantized coded signal is a negative overload code, compares the representative residual signal with the higher limit residual signal so as to form a nonlinear PCM decoded signal which corresponds to the nonlinear PCM converter output signal, the nonlinear PCM converter output signal added with +1 or the nonlinear PCM converter output singal added with −1; an adaptive prediction circuit inputted with the representative decoded signal or the representative decoded signal together with the representative residual signal for producing an adaptive prediction signal at a present time and for determining a prediction characteristic for a next sampling time, whereby the adaptive inverse quantizer produces the representative residual signal as well as the higher limit and lower limit residual signals and the nonlinear PCM code of the representative decoded signal is corrected in accordance with values of the representative residual signal and higher and lower limit residual signals and a value of the quantized coded signal outputted by the ADPCM encoder for forming a nonlinear PCM decoded signal.

According to another embodiment of this invention, there is provided an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, characterized in that there are provided an adaptive inverse quantier which produces, from a quantized coded signal produced by the ADPCM encoder, a first representative residual signal of the quantized coded signal, a second representative residual signal (lower order representative residual signal) being lower by one level than the quantized coded signal, and a third representative residual signal (higher order representative residual signal) being higher by one level than the quantized coded signal, and which determines a characteristic at a next sampling time in accordance with the quantized coded signal; adder means adding an adaptive prediction signal to be described later to the representative residual signal from the adaptive inverse quantizer for producing a representative decoded signal; a nonlinear PCM converter for converting the representative decoded signal into a nonlinear coded PCM signal; a linear PCM converer linearizing the output of the nonlinear PCM converter; subtracting means subtracting the adaptive prediction signal from the output signal of the linear PCM converter for producing a representative decoded residual signal; comparator means for comparing the representative decoded residual signal with the first representative residual signal, the lower order representative residual signal and the higher order representative residual signal to form a nonlinear PCM decoded signal which corresponds to the nonlinear PCM converter output signal, the nonlinear PCM converter output signal added with +1 or the nonlinear PCM converter output signal added with −1; and an adaptive prediction circuit inputted with the representative decoded signal for producing the adaptive prediction signal at present time and for determining a prediction characteristic at a next sampling time, whereby the adaptive inverse quantizer outputs not only the representative residual signal but also the higher order and lower order representative residual signals, and the nonlinear PCM code of the representative decoded signal is corrected by the values of these output signals and the value of the first representative residual signal for producing the nonlinear PCM decoded signal.

In accordance with still another modification of this invention, there is provided an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, characterized in that there are provided an adaptive inverse quantizer which produces, from a quantized coded signal produced by from the ADPCM encoder, a first representative residual signal of the quantized code, a second representative residual signal (lower order representative residual signal) being lower by one level than the quantized code, and a third representative residual signal (higher order representative residual signal) being higher by one level than the quantized code, and which determines a quantizing characteristic at a next sampling time in accordance with the quantized code signal; adder means adding an adaptive prediction signal to be described later to the first representative resisual signal from the reverse adaptive inverse quantizer for producing a representative decoded signal; a nonlinear PCM converter for converting the representative decoded signal into a nonlinear coded PCM signal; a linear PCM converter linearizing the output of the nonlinear PCM converter; subtracting means subtracting the adaptive prediction signal from the output signal of the linear PCM converter for producing a decoded representative residual signal; comparator means which, when the quantized coded signal from the ADPCM encoder is not at an upper or lower limit, that is not overloaded, compares the representative decoded residual signal with, the first representative residual signal, the lower order representative residual signal and the higher order representative residual signal whereas when the quantized coded signal is a positive load code, compares the representative decoded residual signal with the first representative residual signal and the lower order representative residual signal and further when the quantized coded signal is a negative overload coce, compares the representative decoded residual signal with the first representative residual signal and the higher order representative residual signal, so as to form a nonlinear PCM decoded signal which corresponds to the nonlinear PCM converter output signal, the nonlinear PCM converter output signal added with +1 or the nonlinear PCM converter output signal added with −1; and an adaptive prediction circuit inputted with the representative decoded signal for producing an adaptive prediction signal at a present time and for determining the prediction characteristic for a next sampling time, whereby the adaptive inverse quantizer outputs not only the representative residual signal but also the higher order and lower order representative residual signals, and the nonlinear PCM code of the representative decoded signal is corrected by the values of these output signals just mentioned and the value of the first representative residual signal for producing the nonlinear PCM code.

DESCRIPTION OF THE PREFERRED EMBODIMENTS

To have better understanding of the invention, an adaptive differential pulse code modulation circuit (ADPCM) will be generally described based on the two references cited above.

Figure 1:
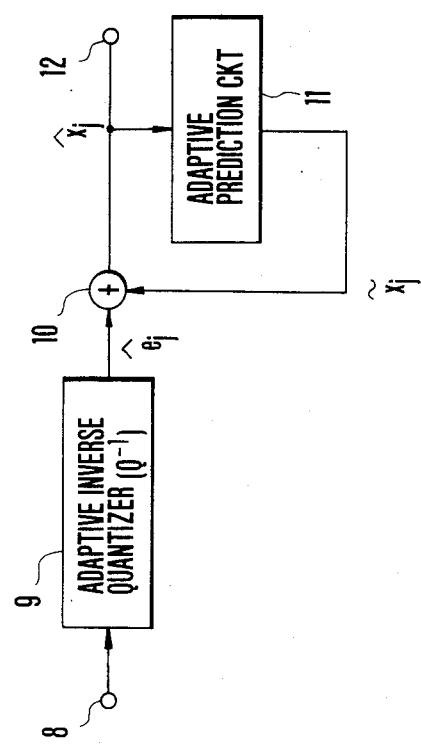
FIG. 1 is a block diagram showing prior art ADPCM encoding/decoding circuit.
Figure 1:
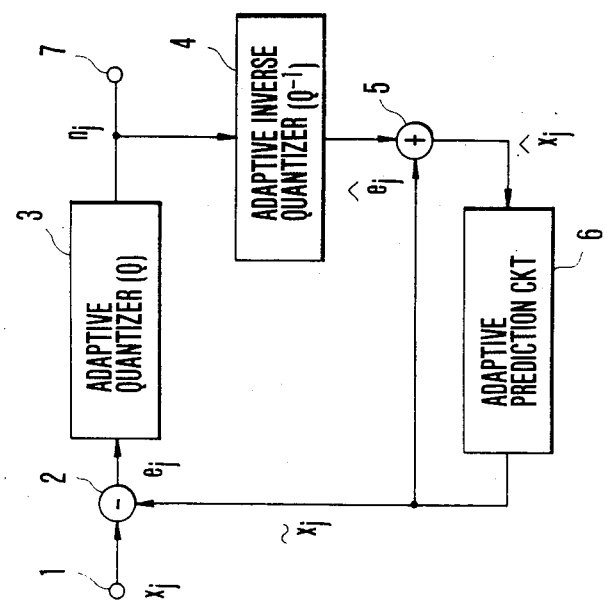

A prior art ADPCM encoding and decoding circuit shown in FIG. 1 comprises an ADPCM encoding circuit including an input signal terminal 1, a subtracter 2, an adaptive quantizer 3, an adaptive inverse quantizer 4, an adder 5, an adaptive prediction circuit 6 and a code output terminal 7; and an ADPCM decoding circuit including a code input terminal 8, an adaptive inverse quantizer 9, an adder 10, an adaptive prediction circuit 11 and an output terminal 12. The adaptive quantizer 3 is used to obtain an output signal having a bit length of N when the input signal has a bit length of M, in which $M > N$. The adaptive quantizer 3 judges the input signal by using $(2^N - 1)$ threshold values to produce an N-bit output signal. In other words, where a linear quantizing threshold value is used, the output signal becomes $n_j$ when the quantizing step-size or width at a sampling time j is expressed by $\Delta_j$ and when the input signal $x_j$ at this time is shown by $$n_j \Delta_j \leq x_j < (n_j+1) \cdot \Delta_j$$

$$n_j \in \{0 \pm 1, \pm 2, \ldots \pm (2^{N-1}-1), -2^{N-1}\}$$

N: number of allocated quantized bits (1)

and the quantizing step-size $\Delta_{j+1}$ at the next sampling time (j+1) can be expanded or compressed in accordance with the level of the input signal to the quantizer by using the following equation.

$$\Delta_{j+1} = \Delta_j^\beta \cdot M(n_j) \quad (2)$$

where $M(n_j)$ is a multiplier or multiplicator definitely determined by $n_j$. One example of multipliers utilized for encoding a voice signal sampled at a frequency of 8 $KH_z$ into four bit (N=4) codes is shown in the following Table I.

TABLE I

| $n_j$ | $M(n_j)$ |
|---|---|
| 0 | 0.8 |
| ±1 | 0.8 |
| ±2 | 0.8 |
| ±3 | 0.8 |
| ±4 | 1.2 |
| ±5 | 1.6 |
| ±6 | 2.0 |
| ±7 | 2.4 |

Where $\beta$ is determined to a positive constant smaller than 1 in equation (2), so long as the adaptive prediction circuit comprises a time-invariable filter, the calculation of $\Delta_j^\beta$ tends to leak the past quantizing step-size so that the circuit would not be affected by transmission line bit errors. For details, reference is made to "Transactions on Communications" pages 1362 to 1365, published by IEEE, in the year of 1975.

When supplied with an N-bit output signal of the adaptive quantizer 3 and a transmitted N-bit adaptive quantizer output signal, the adaptive inverse quantizers 4 and 9 produce regenerated input signal of M bits corresponding to the threshold value so as to inverse quantize the transmitted signal according to an equation $$\hat{x}_j = n_j \Delta_j + 0.5 \Delta_j \quad (3)$$

in which $\hat{x}_j$ is termed a representative value. Since the width between the threshold value is always constant pursuant to the quantizing characteristics given by equations (1) and (3), the width between representative values is constant to define a so-called linear quantizing characteristic. Generally, the width between the threshold values as well as the width between the representative values are not always constant and these widths have values which are dependent upon a statistic distribution function of a signal to be quantized (as will be described in detail later). The transfer functions of the adaptive prediction circuits 6 and 11 are the same as represented by the following equation $$P(Z) = \sum_{i=1}^{k} a_i^j Z^{-i} \quad (4)$$

where $\{a_i^j | i=1, \ldots, k\}$ is called a prediction coefficient at time $j$. The prediction coefficient is varied so as to minimize $\hat{e}_j^2$. It has been known that it is advantageous to vary from time to time the respective coefficient according to the following equation $$a_i^{j+1} = (1 - \delta)a_i^j + g \cdot \hat{e}_j \cdot \hat{x}_{j-i} \quad (5)$$

where $\delta$ and $g$ are positive constants smaller than 1.

The operation of the prior at ADPCM encoding and decoding circuit shown in FIG. 1 will now be described. When an input signal sampled value $x_j$ at a time $j$ is applied to the ADPCM encoding circuit via terminal 1, the subtractor 2 calculates the difference between the input signal $x_j$ and the output signal $\hat{x}_j$ of the adaptive prediction circuit 6, and the calculated difference, residual value, is inputted to the adaptive quantizer 3 as a residual signal $e_j$. As described above, the adaptive quantizer 3 converts the residual signal $e_j$ into an N-bit code $n_j$ which is outputted from the output terminal 7 and simultaneously inputted to the adaptive inverse quantizer 4 which in turn regenerates an M-bit residual signal $\hat{e}_j$ from the code $n_j$. The regenerated residual signal $\hat{e}_j$ and the output $\hat{x}_j$ of the adaptive prediction circuit 6 are added together by adder 5 to regenerate the quantized input signal $\hat{x}_j$. Thereafter, the quantizing step-size of the adaptive quantizer 3, the adaptive inverse quantizer 4 and the coefficient of the adaptive prediction circuit 6 are corrected according to equations (2) and (5) for encoding the next incoming signal. As described above, since the coefficient of the adaptive prediction circuit is corrected to minimize the power of the residual signal $\hat{e}_j$, that is, $\hat{e}_j^2$, the dynamic range of signal $e_j$ becomes smaller than that of signal $x_j$. Considering the fact that the signal is encoded with the same number of bits, the residual signal produced by the adaptive quantizer 3 decreases corresponding to the difference between the dynamic ranges, thus ensuring high accuracy encoding.

In the prior art ADPCM decoding circuit, the received quantized code $n_j$ is inputted through terminal 8 and a regenerated error signal $\hat{e}_j$ is produced by the adaptive inverse quantizer 9. This regenerated error signal $\hat{e}_j$ and the output $\hat{x}_j$ of the adaptive prediction circuit 11 are added together with adder 10 to obtain a signal $\hat{x}_j$ which is applied to the output terminal 12 and the adaptive prediction circuit 11 for predicting the next sampling time. In the ADPCM decoding circuit, too, the quantizing width of the adaptive inverse quantizer is varied from time to time according to equation (2), and the coefficient of the adaptive prediction circuit 11 is varied according to equation (5) so as to minimize the difference between $x_j$ and $\hat{x}_j$, that is, the power of $\hat{e}_j$.

In the ADPCM encoder and decoder, when the internal state variable conditions of the adaptive inverse quantizers 4 and 9 coincide with each other and the internal state variable conditions of the adaptive prediction circuits 6 and 11 coincide with each other, the values of $\hat{e}_j$, $\hat{x}_j$ and $\hat{x}_j$ of the ADPCM encoder and decoder coincide with each other. For this reason, even when the ADPCM encoder and decoder are remotely located, the input signal $x_j$ applied to the terminal 1 and the signal $\hat{x}_j$ outputted from the terminal 12 would have substantially the same value. The terminal 7 of the encoder and the terminal 8 of the decoder are interconnected by a transmission path having a defect of causing bit errors due to heat, noise or the like. In such a case, the ADPCM becomes unstable and often can not restore its normal operating condition. This can be explained as follows.

The transfer function $D(Z)$ between the output of the adaptive inverse quantizer 9 of the ADPCM decoder and the output terminal 12 is determined according to the following equation (6) by utilizing equation (4) as the transfer function of the adaptive predication circuit 11.

$$D(Z) = \frac{1}{1 - P(Z)} = \frac{1}{1 - \sum_{i=1}^{k} a_i^j Z^{-i}} \quad (6)$$

As described above, $\{a^j\}$ is calculated from $\hat{e}_j$. When a transmission path bit error occurs, the corrected value of the prediction coefficient of the adaptive prediction circuit in the ADPCM decoder becomes different from that of the adaptive prediction circuit in the ADPCM encoding circuit. Equation (6) contains K poles determined by the prediction coefficient, and when a transmission path bit error occurs, there is a chance on the ADPCM decoder side that the position of the pole goes out side of a unit circle on the Z plane. Under such a state, the ADPCM decoder starts oscillating and can not restore the correct operation. (See the second paper referred to above).

In the second paper, in order to eliminate such an unstable condition, equation (6) is expanded as shown in equation (7) to provide an ADPCM encoding and decoding circuit having a transfer function with any adaptively moving poles removed:

$$D(Z) = \frac{1}{1 - \sum_{i=1}^{k} \hat{a}_i Z^{-i}} \left( 1 + \sum_{i=1}^{M} b_i^j Z^{-i} \right) \quad (7)$$

wherein the coefficient $\{\hat{a}_i\}$ is a fixed constant, while $\{b_i^k\}$ is an adaptive coefficient. The term $$\left( 1 + \sum_{i=1}^{M} b_i^j Z^{-i} \right)$$

is obtained by dividing equation (6) with $$\left( 1 - \sum_{i=1}^{k} \hat{a}_i Z^{-i} \right)$$

and by cutting off the resulting quotient at the $(M+1)$-th term. When the fixed coefficient $\{a_i\}$ is selected to be commensurate with an average characteristic of voice, the cutting-off error can be made small so that the degradation of the encoding quality is negligible. The method of determining the fixed coefficient $\{a_i\}$ commensurate with the average characteristic of the voice is described in detail in page 498 of the first paper referred to above.

Figure 2:
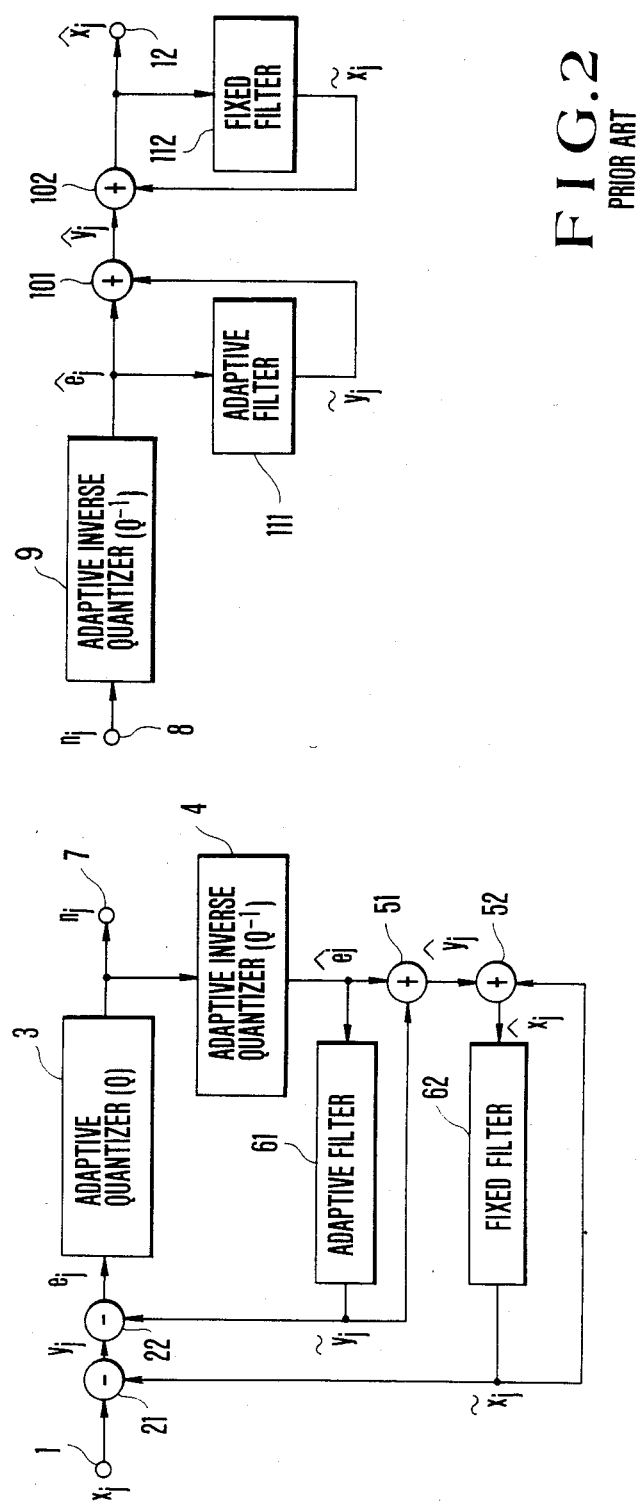
FIG. 2 is a block diagram showing another prior art ADPCM encoding/decoding circuit.

A prior art ADPCM encoding and decoding circuits according to equation (7) is shown in FIG. 2 which comprises an ADPCM encoding circuit including an input terminal 1, subtractors 21 and 22, an adaptive quantizer 3, an adaptive inverse quantizer 4, adders 51 and 52, and an adaptive filter 61, a fixed filter 62 and an output terminal 7; and an ADPCM decoder including an input terminal 8, an adaptive inverse quantizer 9, adders 101, 102, an adaptive filter 111, a fixed filter 112 and an output terminal 12. The fixed filters 62 and 112 have the following transfer function including the fixed prediction coefficient $\{a_i\}$ utilized in equation (4)

$$P2(Z) = \sum_{i=1}^{k} \hat{a}_i Z^{-i} \quad (8)$$

The adaptive filters 61 and 111 have the following transfer function.

$$P1(Z) = \sum_{i=1}^{M} b_i^j Z^{-i} \quad (9)$$

The adaptive coefficient is corrected in a direction so that the power of the signal $e_j$ can be minimized in accordance with the following equation, as is described in the second paper.

$$b_i^{j+1} = (1 - \delta)b_i^j + g\hat{e}_{j-i}\hat{e}_j \quad (10)$$

When an input signal $x_j$ is applied to input terminal 1, the subtractor 21 calculates the difference $y_j$ between the input signal and the output $\hat{x}_j$ of the fixed filter 62. The subtractor 22 subtracts the output $\hat{y}_j$ of the adaptive filter 61 from the difference $y_j$, and the residual signal $e_j$ is applied to the adaptive quantizer 3 which quantizes the signal $e_j$ for outputting a resulting code $n_j$ to the output terminal 7. The code $n_j$ is also applied to the adaptive inverse quantizer 4 to obtain a quantized residual signal $\hat{e}_j$. This residual signal $\hat{e}_j$ is applied to the adaptive filter 61 to be used for the filter calculation at the next sampling time. The residual signal $\hat{e}_j$ is added to the output $\hat{y}_j$ of the adaptive filter 61 by adder 51 to produce a sum signal $\hat{y}_j$ which is applied to adder 52 to be added to the output $\hat{x}_j$ of the fixed filter 62 for regenerating the quantized signal $\hat{x}_j$ of the input signal $x_j$, the regenerated quantized signal being used for the filter claculation at the time of the next sampling. For this reason, so long as the output of the fixed filter 62 is suitable for an average behavior of the input signal, the amplitude level of the first residual signal $y_j$ decreases, and the second residual signal obtained by subtracting the output signal of the adaptive filter 61 from the first residual signal $y_j$ would have a lower level. Generally speaking, while in the adaptive prediction circuit 6 shown in FIG. 1, the next input signal is predicted from the regenerated quantized input value, the adaptive filter shown in FIG. 2 predicts the next input signal from the residual signal. Thus, although the adaptive filter 61 shown in FIG. 2 has low ability, it has a comparable capability as a whole to the encoder shown in FIG. 1 since the fixed filter 62 generates a signal regarding an average characteristic of the input signal.

It is pointed out that the form of the decode in FIG. 2 can be rearranged in a mathematically equivalent way to more closely match the decoder of FIG. 1 by moving one of the adders 101 and 102 from the output of the inverse quantizer 9 to the outputs of the adaptive and fixed filters 111 and 112 and having its output be the other input of the remaining adder. Then the filters 111 and 112 and their adder correspond to the adaptive prediction circuit 11.

The operation of the ADPCM decoder shown in FIG. 2 will now be described. Thus, when a quantized signal is applied to input terminal 8, the adaptive inverse quantizer 9 reproduces a quantized residual signal $\hat{e}_j$ which is applied to adaptive filter 111 to execute an adaptive filter calculation at the time of the next sampling. The residual signal $\hat{e}_j$ is also applied to adder 101 to be added to the output $\tilde{y}_j$ of the adaptive filter 111 to regenerate signal $\hat{y}_j$. The signal $\hat{y}_j$ is added to the output $\tilde{x}_j$ of the fixed filter 112 by adder 102 to reproduce quantized encoder input signal $\hat{x}_j$ which is applied to the output terminal 12 and the fixed filter 112. The transfer functions P1(Z) and P2(Z) of the adaptive filter 111 and the fixed filter 112 are given by equations (8) and (9), respectively.

Since the transfer function D(Z) between the output of the adaptive inverse quantizer 9 and the output terminal 12 is expressed by $$D(Z) = \frac{1 + P1(Z)}{1 - P2(Z)}, \quad (11)$$

this equation coincides with equation (7) and does not contain adaptively movable pole on the Z plane so that a stable operation can be expected even when transmission path errors occurs.

In addition to the ADPCM encoder and decoder described above, there is another type of ADPCM circuit utilizing an adaptive zero/adaptive pole type prediction filter wherein the fixed filters 62 and 112 shown in FIG. 2 are used by limiting the range in which the poles are movable.

When the ADPCM encoder and decoder are incorporated into an existing PCM network, signals encoded by PCM are encoded by ADPCM and then PCM encoded to be transmitted. As a consequence, PCM encoding and ADPCM encoding are performed alternately.

Generally, the arithmetic operation (herein called calculation) in the ADPCM encoder and decoder is executed by using a linear code having more than 14 bits, because it is necessary to perform PCM-like encoding since linearization of an 8 bit nonlinear PCM corresponds to a 14-bit linear PCM. For this reason, where it is possible to connect an ADPCM encoder/decoder to another ADPCM encoder/decoder with a linear code having bits of the number equal to or larger than that of the bits calculated in the ADPCM, even when ADPCM encoder/decoders are connected in cascade, degradation caused by such connection would not occur. For this reason, where the internal state variable conditions of the first and succeeding ADPCM encoder/decoders perfectly coincide with each other, even when a plurality of ADPCM encoder/decoders are connected in cascade, the internal state variable conditions vary in the same manner in respective ADPCM encoder/decoders so that the degradation is limited to that of only one stage ADPCM circuit irrespective of the number of stages connected in cascade.

However, as described above, one ADPCM encoder/decoder and succeeding ADPCM encoder/decoder are interconnected by a nonlinear 8-bit PCM code. As a consequence, with the cascade connection, the connection itself degrades due to the fact that the number of bits which can be used is small and that respective bits of the number that can be used are nonlinearly weighted. Even when the internal state variable conditions of the first ADPCM encoder/decoder and of a succeeding ADPCM encoder/decoder coincide with each other at a certain point, selected ADPCM codes become different due to the fact that the first stage input PCM code and the next stage input PCM code are different by the degree of degradation. Where the selected ADPCM codes are not equal, coincidence of the internal state variable conditions is disturbed due to the fact that the selected ADPCM codes are different, that the multipliers given by the adaptive quantizing equation (2) and shown in Table I become different, and that the adaptive prediction coefficients of equations (5) and (10) become different. For this reason, the degradation caused by the cascade connection becomes the sum of degradation caused by PCM connection and increment in the degradation caused by the ADPCM encoder/decoder and is accumulated corresponding to the number of stages connected in cascade. Thus, as a whole, a great degradation would occur.

The mechanism of the collapse of coincidence of the internal state variable conditions is described in detail in "Proceeding of 1979 ISCAS", pages 969 to 970 so long as the relation between the threshold value and the representative value of the quantizer utilized in the ADPCM encoder/decoder has a linear quantizing characteristic given by equations (1) and (3).

However, the prior art method of maintaining the internal conditions can not be applied to an ADPCM encoder/decoder having a nonlinear quantizing characteristic which has been generally used for improving the quantizing ability. According to the nonlinear quantizing characteristic, a statistical distribution of a signal inputted to a quantizer is investigated and then the threshold value and the representative value suitable for the distribution are determined. For example, where the distribution function has Gaussian destribution and the number of the quantized bits are 4, the characteristic is determined as shown in the following Table II. This is described in detail in "Transactions on Information Theory" pages 7 to 12 published by IRE, 1960, May. As can be clearly noted from Table II, the threshold value spacing and the representative value spacing do not have constant widths different from the linear quantizing characteristic given by equations (1) and (3). Thus, the threshold value is related to the representative value by the following equation, and the threshold values are present between representative values $$TH(n) = \{\hat{x}(n) + \hat{x}(n+1)\}/2 \qquad (12)$$

As a consequence, the prior art method of coinciding internal state variable conditions which utilizes the fact that the threshold value spacing and the representative value spacing are constant can not be used. When encoder/decoder circuits having such quantizers are connected in cascade through nonlinear PCM encoding, the degradation of the characteristic was accumulated.

TABLE II

| Quantized code | Gaussian Distibution Quantizing Characteristic | |
|---|---|---|
| | Threshold value | Representative value |
| 1 | 0.0 | 0.1248 |
| 2 | 0.2582 | 0.3881 |
| 3 | 0.5224 | 0 6568 |
| 4 | 0.7996 | 0.9424 |
| 5 | 1.009 | 1.256 |
| 6 | 1.437 | 1.618 |

TABLE II-continued

| Quantized code | Gaussian Distibution Quantizing Characteristic | |
|---|---|---|
| | Threshold value | Representative value |
| 7 | 1.844 | 2.069 |
| 8 | 2.401 | 2.733 |

(only the positive sign side)

Figure 3:
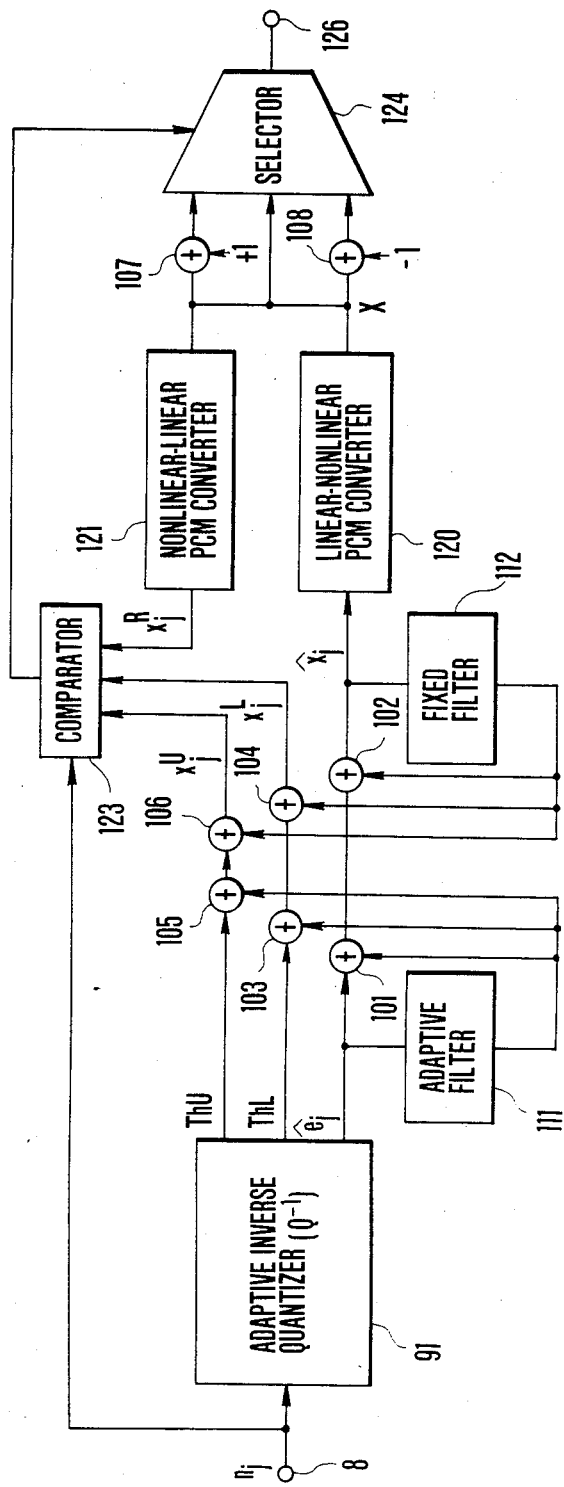
FIG. 3 is a block diagram showing an ADPCM decoding circuit embodying the invention.
Figure 9:
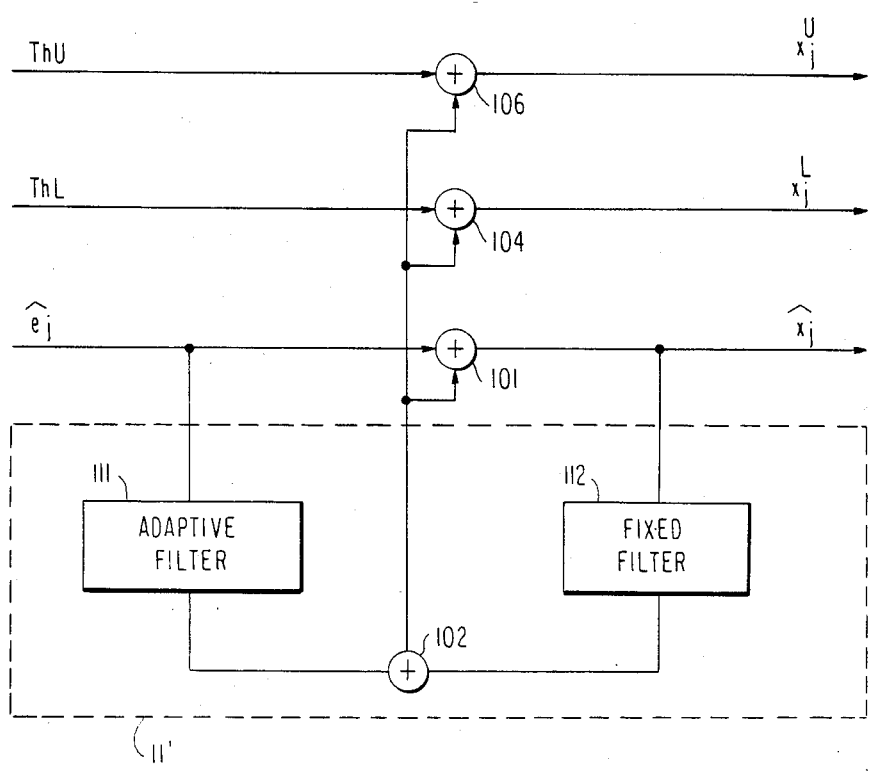
FIG. 9 is a block diagram showing a slight rearrangement of part of the circuit of FIG. 3.

FIG. 3 shows one embodiment of the decoding cirucit embodying the invention and can be used in the circuit shown in FIG. 2. The decoding circuit shown in FIG. 3 comprising an input terminal 8, an inverse quantizer 91, adders 101 to 108, an adaptive filter 111, a fixed filter 112, a linear-nonlinear PCM converter 120, a nonlinear-linear PCM converter 121, a comparator 123, a selector 124 and an output terminal 126. The adaptive filter 111, fixed filter 112, and adders 101 and 102 are identical to those used in the ADPCM decoder shown in FIG. 2. As mentioned previously, the adders 101-106 associated with the adaptive filter 111 and fixed filter 112 can be rearranged so that the decoder of FIG. 3 more closely resembles the decoder of FIG. 1. This rearrangement is shown in FIG. 9 and is mathematically equivalent to the corresponding part of the circuit of FIG. 3. With this rearrangement, the adaptive filter 111, the fixed filter 112 and the adder 102 comprise a modified adaptive predictive filter 11'. As the linear-nonlinear PCM converter 120 and non-lineear PCM converter 121 can be used those described in detail in "BSTJ", pages 1555 to 1588 published in September 1970 by Bell System Laboratories. When supplied with an input ADPCM code n, the adaptive inverse quantizer 91 outputs a value obtained by multiplying the quantizing width $\Delta_j$ with the representative value and the threshoold value corresponding to n shown in Table II with quantizing width $\Delta_j$ respectively, and with the (n+1)-th threshold value. With this construction, the representative value takes the form representing an interval defined by both threshold values. Where n is 8, a sufficiently large value (for example 10000) can be supposed and used as the (n+1)-th threshold value. As in a case wherein n=8, a quantized code in which the absolute value of the representative value becomes a maximum is herein called an overload code. As will be described later, the higher pole limit residual signal in the case of a positive overload code, and the lower pole limit residual signal in the case of the negative overload code are not necessary.

Suppose now that an ADPCM code $n_j$ is inputted to terminal 8, the adaptive inverse quantizer 91 produces values obtained by multiplying the representtive value and the threshold value shown in Table II corresponding to the ADPCM code $n_j$ with the present quantizing width $\Delta_j$, respectively. This output signal has values showing both limits of an interval between a representative residual signal $e_j$ corresponding to the residual signal $\hat{e}_j$ on the side of the encoder and a signal value represented by the representative residual signal $\hat{e}_j$. In the following, the larger limit is shown by ThU and the smaller limit is shown by ThL. Since the adaptive filter 111 and the fixed filter 112 are producing the prediction values at the present time, adders 101 and 102 add the representative residual signal $\hat{e}_j$ to the prediction values outputted by the adaptive filter 111 and the fixed filter 112, the adders 103 and 104 add ThL to the prediction values outputted by the adaptive filter 111 and the fixed filter 112, and adders 105 and 106 add ThU to the prediction values outputted by the adaptive filter 111 and fixed filter 112, so as to produce a representative decoded signal $\hat{x}_j$, a lower limit decoded signal $x_j^L$, and an upper limit decoded signal $x_j^U$. In this case, too, the representative decoded signal $x_j$ has a value representing an interval $(x_j^L, x_j^U)$ The representative decoded signal $\hat{x}_j$ is converted into an ordinary 8-bit PCM code X by the linear-nonlinear PCM converter 120, and the code is again converted into a PCM quantized signal $x_j^R$ by the nonlinear-linear PCM converter 121.

First, let us consider that the input ADPCM code is not an overload code. Assume now that the signal $x_j^R$ lies within the interval $(x_j^L \; x_j^U)$. Under this state, the comparator 123 operates such that when the internal condition of the next stage ADPCM encoder is the same as that of the present stage, in the next stage ADPCM encoder signal $x_j^R$ is used as a linear input, whereas the signal in the interval $(x_j^L, x_j^U)$ is assigned with the same ADPCM code as the present stage. For this reason, the internal state variable conditions of the ADPCM encoder/decoders of the present and next stages are the same.

Let us now consider a case wherein signal $x_j^R$ does not lie within the interval $(x_j^L \cdot x_j^U)$ but satisfies $x_j^R > x_j^U$. Since the input signal to the present stage ADPCM encoder is also a nonlinear PCM signal, at least one PCM representative value would be present in the interval $(x_j^L \cdot x_j^U)$. When the PCM representative value does not lie in this interval, the ADPCM code defining this interval would not be selected. Moreover, since the value obtained by PCM quantizing a represetative value $\hat{x}_j$ in the interval $(x_j^L \cdot x_j^U)$ is represented by $x_j^R$, the PCM quantizing threshold value is present in an interval $(x_j^L \cdot \hat{x}_j)$ and since $x_j^R > x_j^U$, the PCM quantizing width would lie in a range $2(x_j^R - \hat{x}_j)$ to $2(x_j^R - x_j^L)$. Thus, it can be understood that such a condition occurs only when the PCM quantizing width becomes equal to or at most about twice the ADPCM quantizing width. In this case, the difference between the nonlinear PCM code X in which $x_j^R$ has been created and the input nonlinear PCM code of the present stage ADPCM encoder shows that X is a higher PCM code by 1 since $\hat{x}_j$ is present in the interval $(x_j^L \cdot x_j^U)$ and $x_j^R$ does not present. Since the nonlinear PCM code is a special sign magnitude expression, under this condition, the comparator 123 actuates the selector 124 so that the adder 107 is caused to add $+1$ to X when $x_j^R$ is positive whereas the adder 108 is caused to add $-1$ to X when $x_j^R$ is negative. As a consequence, the input PCM signal to the present stage ADPCM encoder and the input PCM signal to the next stage ADPCM encoder will become completely equal, thus maintaining the coincidence of the internal state variable conditions.

Next, let us consider a case wherein $x_j^R$ does not lie within the interval $(x_j^L \cdot x_j^U)$ but satisfies $x_j^R < x_j^L$. In this case, too, at least one PCM representative value would be contained in the interval $(x_j^L \cdot x_j^U)$. Since the value obtained by PCM quantizing the representative value $\hat{x}_j$ in this interval is expressed by $x_j^R$, the PCM quantizing threshold value would present in the interval $(\hat{x}_j \cdot \hat{x}_j^U)$. For this reason, the PCM quantizing width would lie in a range of $2(\hat{x}_j - x_j^R)$ to $2(x_j^U - x_j^R)$ showing that in this case, too, the internal condition would occur when the PCM quantizing width becomes equal to or at least about twice the ADPCM quantizing width. It will be clear that in this case, too, the difference between a nonlinear PCM code X in which $x_j^R$ has occured and the nonlinear PCM code inputted to the present stage ADPCM encoder would be a PCM code in which X is smaller by 1. For this reason, the comparator 123 actuates the selector 125 under this condition to select, as its output, $(X-1)$ obtained by adder 108 when $x_j^R$ is positive whereas $(X+1)$ obtained by adder 107 when $x_j^R$ is negative so that the input PCM signal to the present stage ADPCM encoder becomes perfectly equal to the input PCM signal to the next stage ADPCM encoder, thus maintaining the coincidence of the internal state variable conditions.

The operations of the adaptive filter 111 and the fixed filter 112 shown in FIG. 3 are the same as those of FIG. 2.

As described above, according to this invention, even when a plurality of ADPCM encoder/decoders are connected in a number of stages through PCM encoder/decoder circuits, a characteristic wherein the degradation in the characteristic is limited to only one stage of the ADPCM encoder/decoder can be obtained when the internal state variable conditions of the ADPCM encoder/decoder coincide with each other.

Although FIG. 3 was described as applied to the ADPCM circuit shown in FIG. 2, it will be clear that the circuit shown in FIG. 3 is equally applicable to the ADPCM circuit shown in FIG. 1. In FIG. 2, the prediction filter 112 in the ADPCM circuit was shown as a fixed filter, but the filter may be an adaptive filter.

It should be understood that the invention also covers such modifications wherein the output of the adaptive inverse quantizer 91 comprises a representative value $\hat{e}_j$ and the length between the representative value and a limit value is given by $(ThL - \hat{e}_j)$ and $(ThU - \hat{e}_j)$ and wherein each of $x_j^U$ and $x_j^L$ is added to $\hat{x}_j$, and $(ThU - \hat{e}_j)$ and $(ThL - \hat{e}_j)$ are added together.

Let us consider a case wherein the input ADPCM code is an overload code. Consider now a positive overload, the adaptive quantizer produces a positive overload code only when the input residual signal to the adaptive quanter on the side of the encoder is larger than the maximum threshold value of the adaptive quantizer. Accordingly, with reference to the representative residual signal on the side of the decoder corresponding thereto, only the lower limit residual signal is present and the higher limit residual signal is not present. Accordingly, different from a case in which there is no overload, it is not necessary to consider a case wherein $x_j^R > x_j^U$, and such judgment must be eliminated. Unless the judgment $x_j^R > x_j^U$ is eliminated (which is unnecessary for overload), an imaginary value for $x_j^U$ is necessary which must be sufficiently larger than the value of $x_j^R$ so that such value can not be used for a memory device of a limited word length. In the case of a negative overload, for the same reason as for the positive overload, the lower limit residual signal does not present. Thus, it is not necessary to consider the case in which $x_j^R < x_j^L$, and in the same manner as the positive overload, this judgment must be omitted. For this reason, it is not necessary to detect an overload and to make judgment as to whether the overload is positive or negative.

Figure 4:
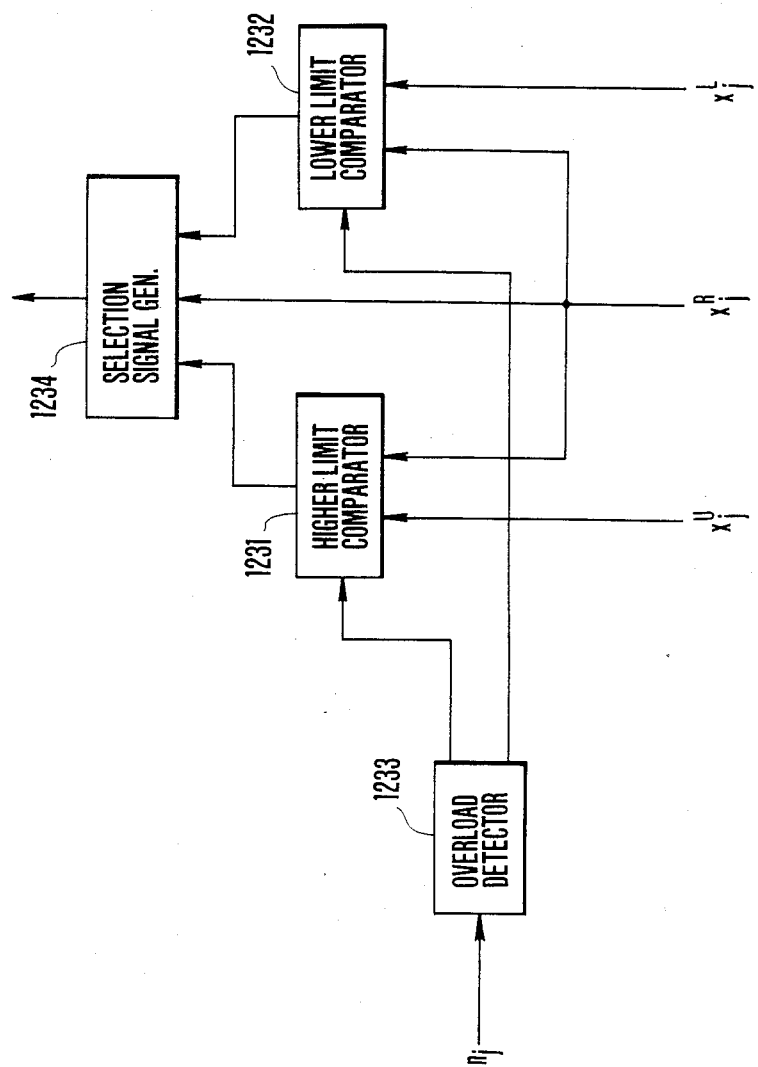
FIG. 4 is a block diagram showing the detail of the comparator shown in FIG. 3.

FIG. 4 shows details of comparator 123 shown in FIG. 3. As shown, the comparator 123 comprises a higher limit comparator 1231, a lower limit comparator 1232, an overload detector 1233 and a selection signal generator 1234. The higher limit comparator 1231 outputs a signal "1" when $x_j^U < x_j^R$ occurs, while in the other case outputs a signal "0". However, each time the overload detector 1233 detects an overload, the higher limit comparator 1231 produces a signal "0". Also, the lower limit comparator 1232 outputs a signal "1" when $x_j^L > x_j^R$ occurs, while in the other cases, it outputs a signal "0". In this case, too, each time the overload detector 1233 detects an overload, the comparator 1232 outputs a signal "0".

When signal "1" from the higher limit comparator 1231 is applied, the selection signal generator 1234 produces an (X+1) selection signal when $x_j^R > 0$, whereas, when $x_j^R < 0$, generates an (X−1) selection signal.

When signal "1" from the lower limit comparator 1232 is applied, the selection signal generator 1234 produces a selection signal (X−1) when $x_j^R > 0$, and a selection signal (X+1) when $x_j^R < 0$.

In other cases, the selection signal generator 1234 produces a selection signal X.

Figure 5:
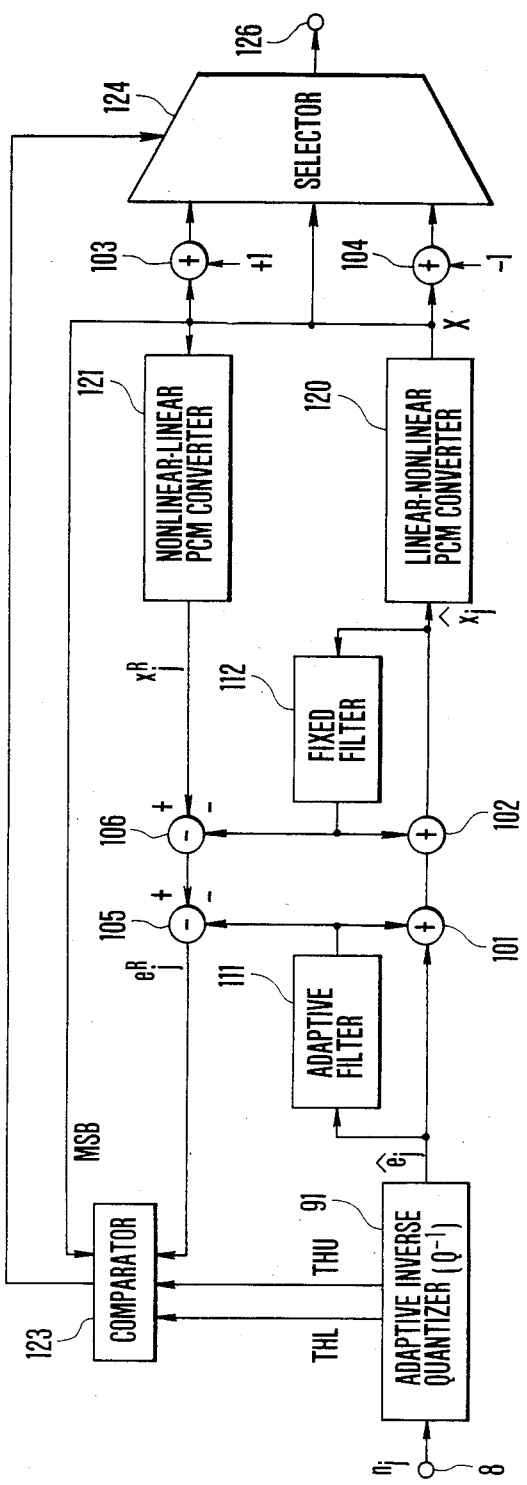
FIG. 5 is a block diagram showing a modified ADPCM decoding circuit embodying the invention.

FIG. 5 shows a modified ADPCM decoding circuit according to this invention. It comprises an input terminal 8, an adaptive inverse quantizer 91, adders 101 to 104, subtractors 105 and 106, an adaptive filter 111, a fixed filter 112, a linear-nonlinear PCM converter 120, a nonlinear-linear PCM converter 121, a comparator 123, a selector 124 and an output terminal 126. The adaptive filter 111, fixed filter 112, adders 101 and 102 are identical to those shown in FIG. 2. Regarding details of the linear-nonlinear PCM converter 120 and the nonlinear-linear converter 121, reference is made to BSTJ, pages 1555 to 1588 published in September 1970 by Bell System Laboratories. When inputted with an input ADPCM code n, the adaptive inverse quantizer 91 outputs a value obtained by multiplying a quantizing width $\Delta_j$ with a representative value and a threshold value corresponding to n and shown in Table II, respectively, and the (n+1)-th threshold value. Then, the representative value represents an interval given by both threshold values. Where n=8, a sufficiently large value, for example, 10000 can be used. The quantized code in which the absolute value of the representative value as in a case where n=8 is herein called an overload signal. However as will be described later, the maximum residual signal when the overload signal is positive and the minimum signal when the overload signal is negative are not necessary.

Upon receiving an ADPCM code $n_j$ at the input terminal 8, the adaptive inverse quantizer 91 produces values obtained by multiplying the representative values and threshold values corresponding to the code $n_j$ and shown in Table II with the present quantizing width $\Delta_j$. The output signals have values showing a representative residual signal $e_j$ corresponding to the residual signal $e_j$ on the side of the encoder, and both limits of the interval of a signal value are represented by the representative residual signal $e_j$. The larger one is herein designated by THU and the smaller one by THL. Since the adaptive filler 111 and the fixed filter 112 are now outputting values (their sum is shown by $P_j$) predicted at this time, where the predicted values outputted by the adaptive filter 111 and the fixed filter 112 are respectively added to the representative residual signal $ê_j$ by means of adders 101 and 102, a representative decoded signal $\hat{x}_j$ can be obtained. Thus, the following equation holds $$\hat{x}_j = ê_j + P_j \quad (12)$$

Again, the representative decoded signal $\hat{x}_j$ represents an interval (THL+$P_j$, THU+$P_j$).

This representative decoded signal $\hat{x}_j$ is converted into an ordinary 8 bit PCM code X by the linear-nonlinear converter 120. The code X is converted again into a PCM quantized signal $x_j^R$ with the nonlinear-linear converter 121. Then the outputs of the adaptive filter 111 and the fixed filter 112 predicted at the present time are subtracted by $x_j^R$ to obtain a representative decoded residual signal $e_j^R$ which is inputted to comparator 123.

Thus, the representative decoded residual signal $e_j^R$ is given by the following equation $$e_j^R = x_j^R - P_j \quad (13)$$

Suppose now that the input ADPCM code is not an overload code and that $e_j^R$ is present in the interval (THL, THU), then comparator 123 selects and outputs a PCM code X through selector 124. Assume now that the internal state variable condition of the ADPCM encoding circuit of the next stage is equal to that of the present stage. Then, in the ADPCM encoding circuit of the next stage, $x_j^R$ would be used as a linear input, while the same ADPCM code as that of the present stage is assigned to a signal in the interval (THL, THU) containing $e_j^R$. For this reason, the internal conditions of the ADPCM encoder/decoders in the present stage and the next stage become identical to each other.

Consider now a case in which $e_j^R$ does not lie in the interval (THL, THU) and wherein $e_j^R >$ THU. The input signal of the present stage ADPCM encoder is also a non-linear PCM signal. Since the PCM quantized value of the representative decoded signal is $x_j^R$ and since the relation between $e_j^R$ and $x_j^R$ is expressed by equation (13), there will be at least one PCM representative value in the interval (THL+$P_j$, THU+$P_j$). If the PCM representative value is not present in this interval, an ADPCM code forming this interval would not be selected.

Furthermore, since the PCM quantized value $X_j^R$ of the representative value $\hat{x}_j$ is present in the interval (THL+$P_j$, THU+$P_j$), the quantized threshold value of PCM is present in the interval (THL+$P_j$, $x_j$). Further, since $\hat{x}_j^R >$ THU+$P_j$, the quantizing width of PCM would lie in a range of $2(x_j^R - \hat{x}_j)$ to $2(x_j^R -$ THL$-P_j)$. It will be clear that this condition occurs when the PCM quantizing width becomes equal to or at most twice the ADPCM quantizing width. In this case, since the difference $\hat{x}_j$ between a nonlinear PCM code X generating $x_j^R$ and an input nonlinear PCM code to the present stage ADPCM encoding circuit lies in the interval (THL+$P_j$, THU+$P_j$) and since there is not $x_j^R$, it can be noted that X is a PCM code higher by 1.

Moreover, since the nonlinear PCM code is a special sign magnitude representation, under this state, the comparator 123 actuates the selector 124. When $x_j^R$ is positive (corresponding to a case wherein the most significant bit (MSB) of the PCM nonlinear code X which has generated $x_j^R$ corresponds to "1"), the adder 103 adds +1 (minimum step size) to X whereas when $x_j^R$ is negative (corresponding to a case wherein the MSB of X is "0"), the adder 104 adds −1 to X so that the selector 124 selects and outputs (X+1) or (X−1). Consequently, the input PCM signal to the present stage ADPCM encoder and the input signal to the next stage ADPCM encoder become perfectly equal, thus maintaining coincidence of the internal conditions.

Let us now consider a case in which $e_j^R$ does not lie in the interval (THL, THU), that is, $x_j^R$ does not exist in the interval (THL+$P_j$, THU+$P_j$) and $e_j^R$<THL. In this case, too, at least one PCM representative value would be contained in the interval (THL+$P_j$, THU+$P_j$). Furthermore, since the PCM quantized value of the representative value $\hat{x}_j$ in this interval is $x_j^R$, the PCM quantized threshold value is present in the interval ($\hat{x}_j$, THU+$P_j$). Thus, the PCM quantized width becomes $2(\hat{x}_j-x_j^R)$ to $2(THU+P_j+x_j^R)$. In this case, it will be understood that $x_j^R$ would be generated when the PCM quantized width becomes equal to or at most twice the ADPCM quantized width. It will be clear that in such a case, the nonlinear PCM code X that has generated $x_j^R$ is smaller by 1 than the input non-linear PCM code to the present stage ADPCM encoding circuit. Accordingly, the comparator 123 operates the selector 124 under this condition. When $x_j^R$ is positive (corresponding to a case in which the MSB of X is "1"), the adder adds −1 to X, while when $x_j^R$ is negative (corresponding to a case wherein the MSB of X is "0"), the adder adds +1 to X, whereby the selector 124 selects and output (X−1) or (X+1). Thus, the input PCM signal to the present stage ADPCM encoding circuit and the input PCM signal to the next stage ADPCM encoder circuit become perfectly equal, thus maintaining the coincidence of the internal conditions.

The operations of the adaptive filter 111 and the fixed filter 112 shown in FIG. 5 are the same as those shown in FIG. 2.

Let us now consider a case wherein the input ADPCM code is an overload code. In this embodiment, consider a case wherein the overload is positive. The adaptive quantizer produces a positive overload code only when the input residual signal of the adaptive quantizer on the side of the encoder is larger than the maximum threshold value of the adaptive quantizer. As a consequence, the corresponding representative residual signal on the side of the decoder contains only the lower limit residual signal and the higher limit residual signal is not present. Accordingly, different from a case in which no overload occurs, it is not necessary to consider a case in which $e_j^R$>THU, and a judgment regarding thereto should be omitted. Unless omitting the judgment of $e_j^R$>THU which is not necessary especially at the time of overload, an imaginary value becomes necessary for THU. Such an imaginary value should be considerably larger than $e_j^R$, and can not be realized with a memory device with a limited word length and impractical. For the same reason as for the positive overload, in the case of the negative overload, too, the lower limit residual signal is not present so that a case wherein $e_j^R$<THL is not required to be considered, and in the same manner as in the positive overload, this judgment should be omitted.

As described above, it is necessary to omit the judgment depending upon whether the detected overload is positive or negative.

Figure 6:
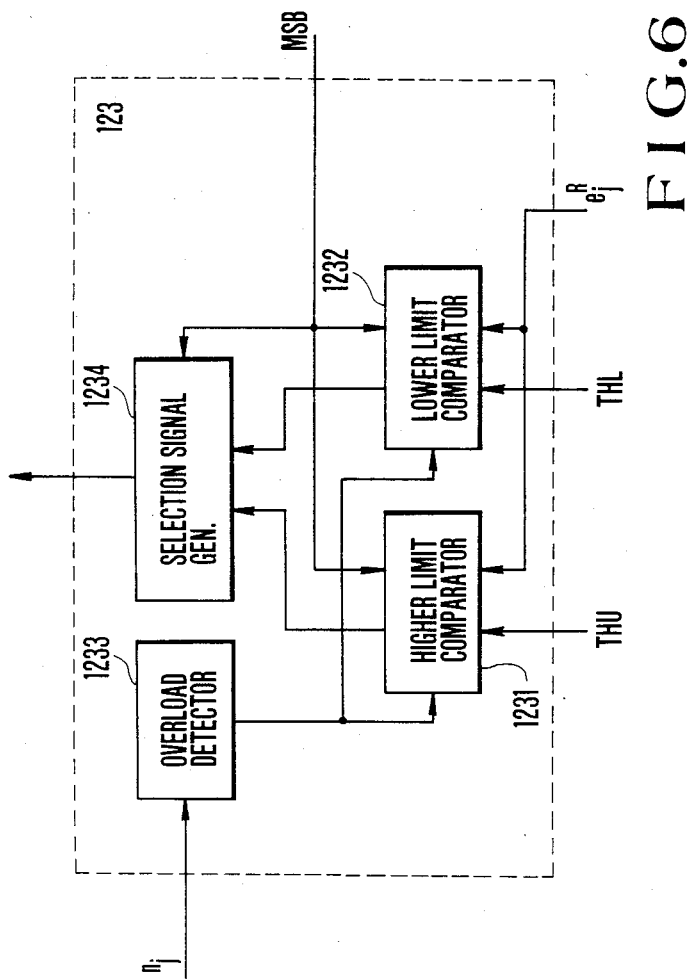
FIG. 6 is a block diagram showing a modification of the comparator shown in FIG. 4.

FIG. 6 shows details of a modification of the comparator 123 shown in FIG. 5. The comparator 123 shown in FIG. 6 comprises a higher limit comparator 1231, a lower limit comparator 1232, an overload detector 1233 and a selection signal generator 1234 which are connected as shown. The higher limit comparator 1231 outputs a signal "1" when THU<$e_j^R$, and in the other cases outputs a signal "0". However, each time the overload detector 1233 detects an overload, the higher limit comparator always outputs a signal "0". Also the lower limit comparator 1232 outputs a signal "1" when THL>$e_j^R$, and in the other cases outputs a signal "0". However, each time the overload detector 1233 detects an overload, the lower limit comparator 1233 outputs a signal "0".

In response to signal "1" from the higher limit comparator 1231, the selection signal generator 1234 generates a selection signal (X+1) when $x_j^R$>0 whereas it generates a selection signal (X−1) when $x_j^R$<0.

In response to the signal "1" from the lower limit comparator 1232, the selection signal generator 1234 generates a selection signal (X−1) when $x_j^R$>0, whereas generates a selection signal (X+1) when $x_j^R$>0. In other cases the selection signal generator 1234 generates a selection signal X.

Figure 7:
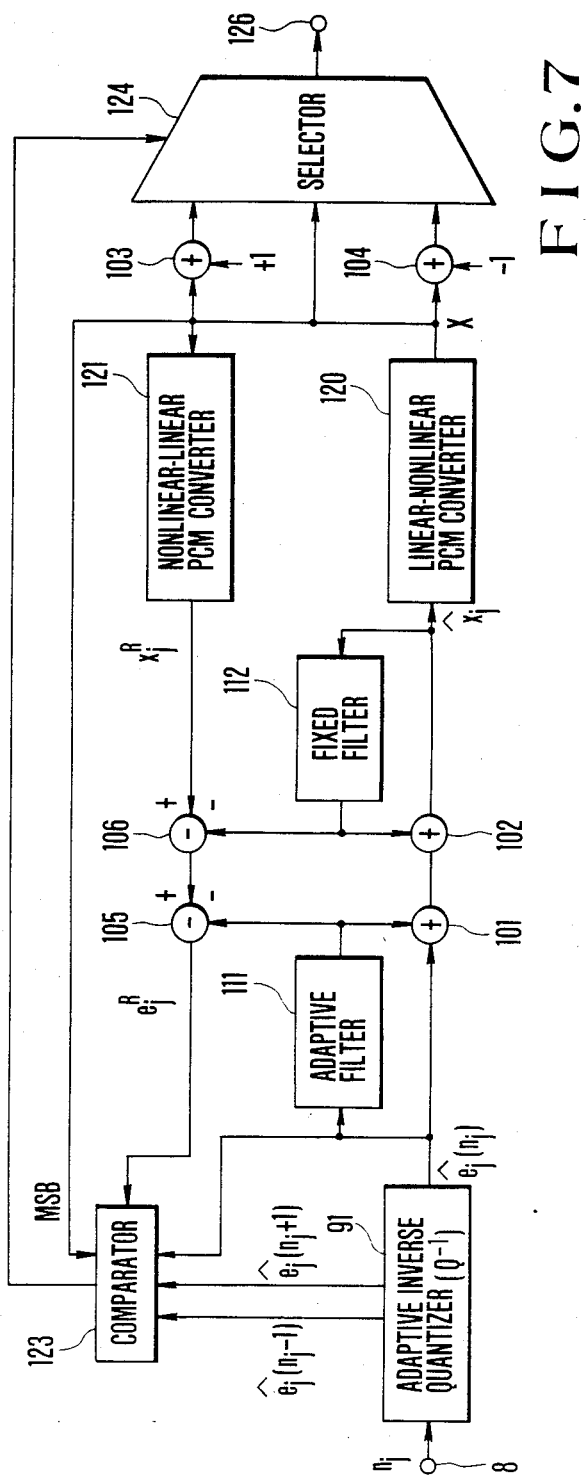
FIG. 7 is a block diagram showing a modification of the ADPCM circuit shown in FIG. 5.

FIG. 7 is a block diagram showing a modification of the ADPCM circuit shown in FIG. 5. This modified ADPCM circuit comprises an input terminal 8, an adaptive inverse quantizer 91, adders 101 to 104, subtractors 105 and 106, an adaptive filter 111, a fixed filter 113, a linear-nonlinear PCM converting circuit 120, a nonlinear-linear PCM converting circuit 121, a comparator 123, a selector 124 and an output terminal 126. The adaptive filter 111, fixed filter 112, and adders 101 and 102 are identical to those used for the ADPCM decoding circuit shown in FIG. 2. The linear-nonlinear PCM converting circuit 120 and the nonlinear-linear PCM converting circuit 121 are described in detail in a paper BSTJ pages 1555 to 1588 published by Bell System Laboratories, in September 1970. The connections of this circuit are the same as those shown in FIG. 5 except for the connection between the adaptive inverse quantizer 91 and the comparator 123.

When inputted with an input ADPCM code n, the adaptive inverse quantizer 91 outputs values respectively obtained by multiplying representative values corresponding to n shown in Table II and representative values corresponding to n−1 and n+1 with quantizing width $\Delta_j$. Then the representative value would represent an interval given by two threshold values. As the representative value corresponding to (n−1) in a case when n=1, is used 0, whereas as the representative values corresponding to (n+1) in a case when n=8, is used a large value for example 10000.

On the other hand, when an ADPCM code $n_j$ is inputted to the input terminal 8, the adaptive inverse quantizer 91 outputs a representative residual signal $\hat{e}_j(n_j)$—hereinafter the representative residual signal when $n_j$ is received is defined by $\hat{e}_j(n_j)$—corresponding to a residual signal $e_j(n_j)$ on the side of the encoder and having a value corresponding to the product between the representative value corresponding to the ADPCM code $n_j$ and shown in Table II and the present quantizing width $\Delta_j$, a lower order representative residual signal $\hat{e}_j(n_j-1)$ corresponding to the product between a representative value corresponding to an ADPCM code $n_j-1$ and the present quantizing width $\Delta_j$, and a higher order representative residual signal $\hat{e}_j(n_j+1)$ corresponding to the product between a representative value corresponding to an ADPCM code $n_j+1$ and the present quantizing width $\Delta_j$. Then, due to the above described optimized quantizing characteristic according to which respective threshold values are positioned between representative values, each of the representative residual signal $\hat{e}_j(n_j)$, higher order representative residual signal $\hat{e}_j(n_j+1)$ and lower order representative residual signal $\hat{e}_j(n_j-1)$ would have a value representing a signal in the interval given by upper and lower threshold values.

Since the adaptive filter 111 and the fixed filter 112 are now outputting values (their sum is $P_j$) predicted at the present time, the output predicted values of the adaptive filter 111 and the fixed filter 112 are respectively added to the representative residual signal $\hat{e}_j$ by means of the adders 101 and 102 so as to obtain the representative decoded signal $\hat{x}_j$. Accordingly, the following equation holds $$\hat{x}_j = \hat{e}_j(n_j) + P_j \qquad (14)$$

The representative decoded signal $\hat{x}_j$ is converted into an ordinary 8-bit PCM code X by the linear-nonlinear PCM converter 120. This code is again converted into a PCM quantized signal $x_j^R$ by the nonlinear-linear PCM converter 121, which is subtracted from the prediction values at the present time outputted from the adaptive filter 111 and the fixed filter 112 respectively by means of subtractors 105 and 106 so as to be converted into the representative decoded residual signal $e_j^R$ which is applied to the comparator 123. Accordingly, the representative decoded residual signal $e_j^R$ is given by the following equation.

$$e_j^R = x_j^R - P_j \qquad (15)$$

Let us denote a value obtained by multiplying a threshold value positioned intermediate of the representative value of ADPCM code $n_j-1$ and the representative value of $n_j$ with the present quantizing width $\Delta_j$ by $TH(n_j-1)$, and denote a value obtained by multiplying a threshold value positioned intermediate of the representative value of the ADPCM code $n_j$ and the representative value of $n_j+1$ with the present quantizing width $\Delta_j$ by $TH(n_j)$. Then, when $e_j^R$ is present in an interval $[TH(n-1), TH(n_j)]$, that is, in a case wherein $e_j^R$ is closest to $\hat{e}_j(n_j)$ among the three representative residual signals $\hat{e}_j(n_j)$, $\hat{e}_j(n_j-1)$, and $\hat{e}_j(n_j+1)$, the comparator 123 actuates the selector 124 to cause it to select and output the PCM code X.

When the internal state variable condition of the ADPCM encoder of the next stage is the same as that of the present stage, in the next stage ADPCM encoder, $x_j^R$ is used as a linear input, and the same ADPCM code as that of the present stage is assigned to a signal in which $e_j^R$ is present in the interval $[TH(n_j-1), TH(n_j)]$. For this reason, the internal conditions of the ADPCM encoder/decoders in the present and next stages would become identical.

Let us consider a case wherein $e_j^R$ does not lie in the interval $[TH(n_j-1), TH(n_j)]$ and $e_j^R > TH(n_j)$, that is, $e_j^R$ is the closest to $e(n_j+1)$ among the three representative residual signals described above. Since the input signal to the present stage ADPCM encoder is a nonlinear PCM signal, the value obtained by PCM quantizing the representative decoded signal $x_j$ is expressed by $x_j^R$, and the relation between $e_j^R$ and $x_j^R$ is shown by equation (14), at least one representative value of PCM signal would be contained in the interval $[TH(n_j-1)+P_j, TH(n_j)+P_j]$.

If the PCM representative value does not lie in this interval, the ADPCM code that has formed this interval would not be selected.

Since the value obtained by PCM quantizing the representative value $\hat{x}_j$ in the interval $[TH(n_j-1)+P_j, TH(n_j)+P_j]$ is expressed by $x_j^R$, the PCM quantized threshold value would present in an interval $[TH(n_j-1)+P_j, \hat{x}_j]$. Furthermore, since $x_j^R > TH(n_j)+P_j$, the PCM quantizing width would lie in a range of $2(x_j^R - \hat{x}_j)$ to $2(x_j^R - TH(n_j-1) - P_j)$. It can be noted that, this condition occurs when the PCM quantizing width becomes equal to or at most twice the ADPCM quantizing width. In such a case, the nonlinear PCM code which has formed $x_j^R$ is larger by 1 than the input nonlinear PCM code to the present stage ADPCM encoder because $\hat{x}_j$ is present in the interval $[TH(n_j-1)+P_j, TH(n_j)+P_j]$ and there is no $x_j^R$.

Furthermore, since the nonlinear PCM code is a special sign magnitude expression, the comparator 123 actuates the selector 124 under this condition so as to cause it to select and output an output obtained by adding $+1$ (minimum step-size) to X with adder 103 when $x_j^R$ is positive (corresponding to a case wherein the MSB of the nonlinear PCM code that has generated $x_j^R$ is "1"), whereas when $x_j^R$ is positive (corresponding to a case wherein the MSB of X is "0"), an output obtained by adding $-1$ to X with adder 104. Consequently, the input PCM signal to the present stage ADPCM encoder and the input signal to the next stage ADPCM encoder perfectly coincide with each other, thus maintaining the coincidence of the internal conditions.

Let us now consider a case wherein $e_j^R$ does not lie in the interval $[TH(n_j-1), TH(n_j)]$, that is, $x_j^R$ does not present in the interval $[TH(n_j-1)+P_j, TH(n_j)+P_j]$, and wherein $e_j^R < TH(n_j-1)$, that is, $e_j$ is the most closest to $e_j(n_j-1)$ among the three representative residual signals described above. In this case, too, at least one PCM representative value would be contained in the interval $[TH(n_j-1)+P_j, TH(n_j)+P_j]$. Furthermore, since the PCM quantized value of a representative value $\hat{x}_j$ in this interval is equal to $x_j^R$, the PCM quantized threshold value would be contained in the interval $[\hat{x}_j, TH(n_j)+P_j]$. Consequently, the PCM quantizing width becomes equal to $2(\hat{x}_j - x_j^R)$ to $2[TH(n_j)+P_j - x_j^R]$. Thus, in this case, too, it will be noted that, $x_j^R$ would be generated when the PCM quantizing width becomes equal to or at most twice the ADPCM quantizing width. In this case, the nonlinear PCM code X that has generated $x_j^R$ is smaller by 1 than the nonlinear PCM code inputted to the present stage ADPCM encoder. Under this condition, the comparator 123 actuates the selector 124 to cause it to select and output $(X-1)$ obtained by adder 104 when $x_j^R$ is positive (corresponding to a case wherein the MSB of X is "1"), whereas $(X+1)$ obtained by adder 103 when $x_j^R$ is negative (corresponding to a case wherein the MSB of X is "0"). As a consequence, the input PCM signal to the present stage ADPCM encoder and the PCM signal to the next stage ADPCM encoder become perfectly equal, thus maintaining the coincidence of the internal state variable conditions.

It can be noted that the output of the adaptive inverse quantizer 91 may have a representative value and the spacing between representative values are, for example, $\hat{e}_j(n_j)$, $[\hat{e}_j(n_j-1)-\hat{e}_j(n_j)]$, $[\hat{e}_j(n_j+1)-\hat{e}_j(n_j)]$ and that $e_j^R$ can be obtained by subtracting $x_j$ from $x_j^R$.

Figure 8:
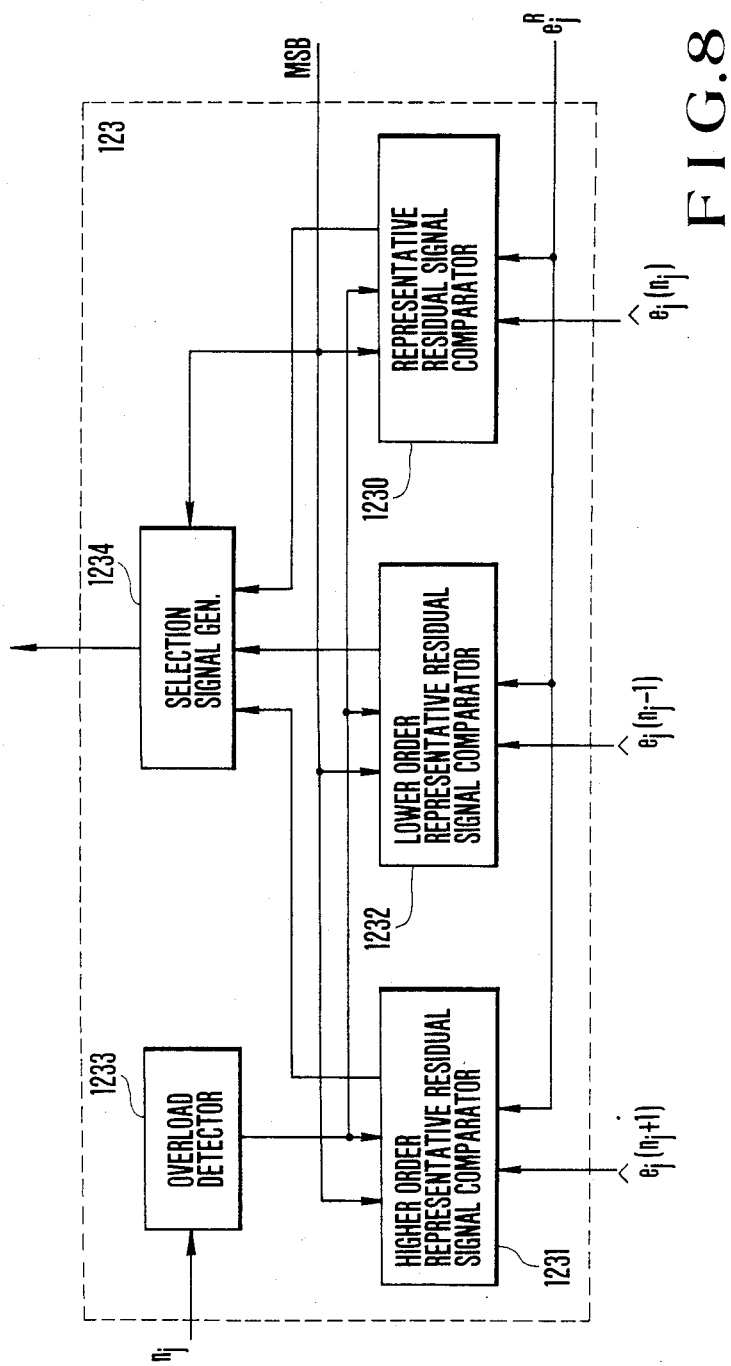
FIG. 8 is a block diagram showing another modification of the comparator shown in 7.

FIG. 8 is a block diagram showing a modification of the comparator 123 shown in FIG. 4. The comparator shown in FIG. 8 is constituted by a representative residual signal comparator 1230, a higher order representative residual signal comparator 1231, a lower order representative residual signal comparator 1232, an overload detector 1233 and a selection signal generator 1234. The representative residual signal comparator

1230 subtracts $e_j^R$ from $\hat{e}_j(n_j)$ to output a difference. The higher order representative residual signal comparator 1231 subtracts $e_j^R$ from $\hat{e}_j(n_j+1)$ to output a difference. However, when the overload detector 1233 detects a positive overload, the comparator 1231 outputs a signal "0". In the same manner, the lower order representative residual signal comparator 1233 subtracts $e_j^R$ from $\hat{e}_j(n_j-1)$ and outputs a difference. In this case too, when the overload detector 1233 detects a negative overload, the comparator 1232 produces a signal "0".

The selection signal generator 1234 compares the outputs of representative residual signal comparator 1230, higher order representative residual signal comparator 1231 and lower order representative residual signal comparator 1232 so as to generate a selection signal $(X+1)$ when $x_j^R > 0$, whereas a selection signal $(X-1)$ when $x_j^R < 0$, in a case where the output of the higher order representative residual signal comparator 1231 is a minimum (except a case wherein a positive overload is detected). Furthermore, when the output of the lower order representative residual signal comparator 1232 is a minimum (except for the case wherein a negative overload is detected), the selection signal generator 1234 generates a selection signal $(X-1)$ when $x_j^R > 0$, and a selection signal $(X+1)$ when $x_j^R < 0$. In other cases, the selection signal generator 1234 generates a selection signal X.

It will be noted that modifications shown in FIGS. 4 to 8 have the same advantage as that shown in FIG. 3.

What is claimed is:

1. In an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, the improvement which comprises:

an adaptive inverse quantizer which produces, from a quantized coded signal produced by said ADPCM encoder, a representative residual value signal, a lower limit residual signal and a higher limit residual signal in accordance with said residual signal on the side of said encoder, and which determines a quantizing characteristic at a next sampling time in accordance with said quantized coded signal;

adder means adding an adaptive prediction signal to be described later to each of said representative residual value signal, said lower limit residual signal and said higher limit residual signal produced by said adaptive inverse quantizer for producing a representative decoded value signal, a lower limit decoded value signal and a higher limit decoded value signal;

a nonlinear PCM converter for converting said representative decoded value signal into a nonlinear encoded PCM signal;

a linear PCM converter linearizing said nonlinear PCM signal for producing a linear PCM signal;

comparator means for comparing said linear PCM signal with said lower limit decode value signal and with said higher limit decoded value signal;

selective addition means responsive to said comparator means for adding +1 or adding −1 or not adding to said nonlinear PCM signal to form a nonlinear PCM decoded output signal which corresponds to said nonlinear PCM signal, the nonlinear PCM signal added with +1 or the nonlinear PCM signal added with −1; and an adaptive prediction circuit imputted with said representative decoded value signal or said representative decoded value signal together with said representative residual value signal for producing an adaptive prediction signal at a present time and for determining a prediction characteristic at a next sampling time;

whereby in a cascade connected condition in which a PCM encoding/decoding and an ADPCM encoding/decoding are repeated alternately, once internal state variable conditions of respective ADPCM encoding/decoding circuits have coincided perfectly, in the following time, degradation of the characteristic caused by the cascade connection is made to be the same as that of one ADPCM stage.

2. The ADPCM decoding circuit according to claim 1 wherein said comparator means compares said lower limit decoded value signal with said higher limit decoded value signal when said received ADPCM quantized code signal is not an upper limit value or lower limit value, that is, not an overload signal, compares an output of said linear PCM converter with said lower limit decoded value signal when said received ADPCM quantized code signal is a positive overload code; and compares the output of said linear PCM converter with said higher limit decoded value signal when said received ADPCM quantized code signal is a negative overload signal for utilizing the output of said nonlinear PCM converter as it is or after adding thereto +1 or −1, as a nonlinear PCM decoded signal.

3. The ADPCM decoding circuit according to claim 2 wherein said comparator means comprises an overload detector supplied with a signal $n_j$, a higher limit comparator (1231) inputted with an output of said overload detector and signals $x_j^U$ and $x_j^R$, a lower limit comparator (1232) inputted with an output of said overload detectors and signals $x_j^L$ and $x_j^R$, and a selection signal generator (1234) inputted with outputs of said higher and lower limit comparators and said signal $x_j$.

4. In an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, the improvement which comprises:

an adaptive inverse quantizer which produces, from a quantized coded signal produced by said ADPCM encoder, a representative residual value signal, a lower limit residual signal and a higher limit residual signal in accordance with said residual signal on the side of said encoder, and which determines a quantizing characteristic at a next sampling time in accordance with said quantized coded signal;

adder means adding an adaptive prediction signal to be described later to said representative residual value signal from said adaptive inverse quantizer for producing a representative decoded signal;

a nonlinear PCM converter for converting said representative decoded signal into a nonlinear coded PCM signal;

a linear PCM converter for linearizing an output of said nonlinear PCM converter;

subtracting means subtracting the adaptive prediction signal from the output signal of said linear PCM converter for producing a representative decoded residual signal;

comparator means for comparing said representative decoded residual signal with said lower limit residual signal and with said higher limit residual signal;

selective addition means responsive to said comparator means for adding +1 or adding −1 or not adding to said nonlinear PCM signal to form a nonlinear PCM decoded output signal which corresponds to said nonlinear PCM converter output signal, the nonlinear PCM signal added with +1 or the nonlinear PCM signal added with −1; and an adaptive prediction circuit inputted with said representative decoded value signal or said representative decoded value signal together with said representative residual value signal for producing an adaptive prediction signal at a present time and for determining a prediction characteristic at a next sampling time, said adaptive inverse quantizer producing higher limit and lower limit residual signals in addition to said representative residual signal and values of these signals being used to correct said nonlinear PCM code of said representative decoded signal so as to form said nonlinear PCM decoded signal.

5. In an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, the improvement which comprises:

an adaptive inverse quantizer which produces, from a quantized coded signal produced by said ADPCM encoder, a representative residual signal, a lower limit residual signal and a higher limit residual signal in accordance with said residual signal on the side of said encoder, and which determines a quantizing characteristic at a next sampling time in accordance with said quantized coded signal;

adder means adding an adaptive prediction signal to be described later to said representative residual signal from said adaptive inverse quantizer for producing a representative decoded signal;

a nonlinear PCM converter for converting said representative decoded signal into a nonlinear coded PCM signal;

a linear PCM converter linearizing an output of said nonlinear PCM converter;

subtracting means subtracting the adaptive prediction signal from an output signal of said linear PCM converter for producing a representative residual signal;

comparator means which, when said quantized coded signal from said ADPCM encoder is not at an upper or lower limit, that is, not overloaded, compares said representative decoded residual signal with said lower limit residual signal and with said higher limit residual signal whereas when said quantized coded signal is a positive overload code, compares said representative decoded residual signal with said lower limit residual signal and further when said quantized coded signal is a negative overload code, compares said representative residual signal with said higher limit residual signal;

selective addition means responsive to said comparator means for adding +1 or adding −1 or not adding to said nonlinear PCM signal to form a nonlinear PCM decoded output signal which corresponds to said nonlinear PCM converter output signal, the nonlinear PCM converter output signal added with +1 or the nonlinear PCM converter output signal added with −1; and an adaptive prediction circuit inputted with said representative decoded value signal or said representative decoded value signal together with said representative residual value signal for producing an adaptive prediction signal at a present time and for determining a prediction characteristic for a next sampling time;

whereby said adaptive inverse quantizer produces said representative residual signal as well as said higher limit and lower limit residual signals and the nonlinear PCM code of said representative decoded signal is corrected in accordance with values of said representative residual signal and higher and lower linmit residual signals and a value of said quantized code signal outputted by said ADPCM encoder for forming a nonlinear PCM decoded signal.

6. In an ADPCM decoding circuit of the type which receives a coded signal outputted from an ADPCM encoder which adaptively quantizes at each sampling time a residual signal which is a difference between a signal formed by linearizing an input nonlinear coded PCM signal and a prediction signal adaptively predicted, and which delivers a nonlinear PCM decoded signal, the improvement which comprises:

an adaptive inverse quantizer which produces, from a quantized coded signal produced by said ADPCM encoder, a first representative residual signal of said quantized encoded signal, a second representative residual signal (lower order representative residual signal) being lower by one level than said quantized coded signal, and a third representative residual signal (higher order representative residual signal) being higher by one level than said quantized coded signal, and which determines a quantizing characteristic at a next sampling time in accordance with said quantized coded signal;

adder means adding an adaptive prediction signal to be described later to said representative residual signal from said adaptive inverse quantizer for producing a representative decoded signal;

a nonlinear PCM converter for converting said repesentative decoded value signal into a nonlinear coded PCM signal;

a linear PCM converter linearizing an output of said nonlinear PCM converter;

subtracting means subtracting said adaptive prediction signal from the output signal of said linear PCM converter for producing a representative decoded residual signal;

comparator means for comparing said representative decoded residual signal with said first representative residual signal, said lower order representative residual signal and said higher order representative residual signal;

selective addition means responsive to said comparator means for adding +1 or adding −1 or not adding to said nonlinear PCM signal to form a nonlinear PCM decoded output signal which corresponds to said nonlinear PCM converter output signal, the nonlinear PCM converter output signal added with +1 or the nonlinear PCM converter output signal added with −1; and an adaptive prediction circuit inputted with said representative decoded signals for producing the adaptive prediction signal at a present time and for determining a prediction characteristic at a next sampling time;

whereby said adaptive inverse quantizer outputs not only said representative residual signal but also said higher order and lower order representative residual signals, and the nonlinear PCM code of said representative decoded signal is corrected by values of these output signals and a value of said first representative residual signal for producing said nonlinear PCM decoded signal.

7. In an ADPCM decoding circuit of the type which receives a coded signal outputted from an ADPCM encoder which adaptively quantizes at each sampling time a residual signal which is a difference between a signal formed by linearizing an input nonlinear coded PCM signal, and a prediction signal adaptively predicted, and which delivers a nonlinear PCM decoded signal, the improvement which comprises:

an adaptive inverse quantizer which produces, from a quantized coded signal produced by said ADPCM encoder, a first representative residual signal of said quantized code, a second representative residual signal (lower order representative residual signal) being lower by one level than said quantized code, and a third representative residual signal (higher order representative residual signal) being higher by one level than said quantized code, and which determines a quantizing characteristic at a next sampling time in accordance with said quantized code signal;

adder means adding an adaptive prediction signal to be described later to said first representative residual signal from said adaptive inverse quantizer for producing a representative decoded signal;

a nonlinear PCM converter for converting said representative decoded signal into a nonlinear coded PCM signal;

a linear PCM converter for linearizing an output of said nonlinear PCM converter;

subtracting means subtracting said adaptive prediction signal from the output signal of said linear PCM converter for producing a decoded representative residual signal;

comparator means which, when said quantized coded signal from said ADPCM encoder is not at an upper or lower limit, that is, not overloaded, compares said representative decoded residual signal with said first representative residual signal, said lower order representative residual signal and said higher order representative residual signal, whereas when said quantized encoded signal is a positive load code, compares said representative decoded residual signal, said first representative residual signal and said lower order representative signal, and further when said quantized encoded signal is an overload code, compares said representative decoded residual signal, said first representative residual signal;

selective addition means responsive to said comparator means for adding +1 or adding −1 or not adding to said nonlinear PCM signal so as to form a nonlinear PCM decoded output signal which corresponds to said nonlinear PCM converter output signal, the nonlinear PCM converter output signal added with +1 or the nonlinear PCM converter output signal added with −1; and an adaptive prediction circuit inputted with said representative decoded value signal for producing an adaptive prediction signal at a present time and for determining a prediction characteristic at a next sampling time;

whereby said adaptive inverse quantizer outputs not only said representative residual signal but also said higher order and lower order representative residual signals, and the nonlinear PCM code of said representative decoded signal is corrected by the values of these output signals just mentioned and the value of said first representative residual signal for producing said nonlinear PCM code.

* * * * *

UNITED STATES PATENT AND TRADEMARK OFFICE
CERTIFICATE OF CORRECTION

PATENT NO. : 4,571,737
DATED : February 18, 1986
INVENTOR(S) : Nishitani et al

It is certified that error appears in the above-identified patent and that said Letters Patent is hereby corrected as shown below:

Column 1, line 30, change "degradion" to --degradation--.

Column 10, line 20 (formula 11), change "D(2)" to --D(Z)--.

Column 18, line 14, change "$x_j^R > 0$" to --$x_j^R < 0$--.

Signed and Sealed this

Fifth Day of August 1986

[SEAL]

Attest:

DONALD J. QUIGG

Attesting Officer

Commissioner of Patents and Trademarks